(12) United States Patent
Smith et al.

(10) Patent No.: US 10,147,524 B2
(45) Date of Patent: Dec. 4, 2018

(54) RESISTOR AND METHOD FOR MAKING SAME

(71) Applicant: VISHAY DALE ELECTRONICS, LLC, Columbus, NE (US)

(72) Inventors: Clark L. Smith, Columbus, NE (US); Joel J. Smejkal, Columbus, NE (US); David Lange, Columbus, NE (US); Thomas L. Bertsch, Pierce, NE (US); Steve Hendricks, Columbus, NE (US); Rod Brune, Columbus, NE (US)

(73) Assignee: VISHAY DALE ELECTRONICS, LLC, Columbus, NE (US)

( * ) Notice: Subject to any disclaimer, the term of this patent is extended or adjusted under 35 U.S.C. 154(b) by 0 days.

(21) Appl. No.: 15/193,530

(22) Filed: Jun. 27, 2016

(65) Prior Publication Data

US 2017/0032875 A1    Feb. 2, 2017

Related U.S. Application Data

(60) Continuation of application No. 14/280,230, filed on May 16, 2014, now Pat. No. 9,378,872, which is a
(Continued)

(51) Int. Cl.
*H01C 1/148* (2006.01)
*H01C 1/144* (2006.01)
(Continued)

(52) U.S. Cl.
CPC ............. *H01C 1/148* (2013.01); *G01R 1/203* (2013.01); *H01C 1/144* (2013.01); *H01C 10/00* (2013.01);
(Continued)

(58) Field of Classification Search
CPC ........ H01C 1/144; H01C 10/00; H01C 1/148; G01R 1/023; G01R 31/3679
(Continued)

(56) References Cited

U.S. PATENT DOCUMENTS 2,023,517 A    12/1935 Creager et al.
2,360,263 A    10/1944 Osterheld
(Continued)

FOREIGN PATENT DOCUMENTS

DE    466 137 C    10/1928
DE    28 56 353 A1    7/1980
(Continued)

OTHER PUBLICATIONS

Wu, "A New Method of Solid State Welding: Electromagnetic Welding," Ordnance Material Science and Engineering; Seventh Issue; p. 36; published Jul. 30, 1991 (Japanese Language and English Translation).
(Continued)

*Primary Examiner* — Kyung Lee
(74) *Attorney, Agent, or Firm* — Volpe and Koenig, P.C.

(57) ABSTRACT

A resistor includes a substantially cylindrical resistive element having a resistance of less than about 1 mΩ, a substantially cylindrical first termination electrically connected to the resistive element and a second termination electrically connected to the resistive element. The substantially cylindrical first termination is hollow to allow for accepting a connection such as from a battery cable. In addition there may be sense leads present on the resistor. A method of forming a substantially cylindrical resistor includes forming a hollow cylindrical resistor body by rolling a flat sheet comprising a resistive element and a first termination and a second termination joined on opposite ends of the resistive element.

24 Claims, 3 Drawing Sheets

Related U.S. Application Data continuation of application No. 13/730,155, filed on Dec. 28, 2012, now Pat. No. 8,730,003, which is a continuation of application No. 13/051,585, filed on Mar. 18, 2011, now Pat. No. 8,344,846, which is a division of application No. 12/026,939, filed on Feb. 6, 2008, now Pat. No. 7,911,319.

(51) Int. Cl.
  *H01C 10/00* (2006.01)
  *G01R 1/20* (2006.01)
  *H01C 17/28* (2006.01)
  *G01R 31/36* (2006.01)

(52) U.S. Cl.
  CPC ......... *H01C 17/28* (2013.01); *G01R 31/3679* (2013.01); *Y10T 29/49082* (2015.01)

(58) Field of Classification Search
  USPC .................................................. 338/329, 332
  See application file for complete search history.

(56) References Cited

U.S. PATENT DOCUMENTS

| | | |
|---|---|---|
| 2,491,872 A | 12/1949 | Neuman |
| 2,708,701 A | 5/1955 | Viola |
| 2,879,363 A | 3/1959 | Mucher |
| 2,927,048 A | 3/1960 | Pritikin |
| 2,980,877 A | 4/1961 | Liermann et al. |
| 3,803,708 A | 4/1974 | Wada et al. |
| 3,858,147 A | 12/1974 | Caddock |
| 4,185,263 A | 1/1980 | Frey |
| 4,275,375 A | 6/1981 | Valiance |
| 4,333,069 A | 6/1982 | Worth et al. |
| 4,417,389 A | 11/1983 | Lopacki et al. |
| 4,859,981 A | 8/1989 | Peschl |
| 5,218,751 A | 6/1993 | Chen et al. |
| 5,287,083 A | 2/1994 | Person et al. |
| 5,367,906 A | 11/1994 | Tsuruoka et al. |
| 5,398,549 A | 3/1995 | Suzuki |
| 5,604,477 A | 2/1997 | Rainer et al. |
| 5,676,872 A | 10/1997 | Garcia-Rodriguez |
| 5,729,814 A | 3/1998 | Suzuki et al. |
| 5,824,998 A | 10/1998 | Livshiz et al. |
| 5,958,269 A | 9/1999 | Suzuki et al. |
| 6,085,011 A | 7/2000 | Klausmann et al. |
| 6,229,125 B1 | 5/2001 | Livshiz et al. |
| 6,557,252 B2 | 5/2003 | Bennett et al. |
| 6,599,137 B2 | 7/2003 | Modina |
| 6,779,550 B1 | 8/2004 | Bennett et al. |
| 7,026,578 B2 | 4/2006 | Mori et al. |
| 7,911,319 B2 | 3/2011 | Smith et al. |
| 2004/0112942 A1 | 6/2004 | Durand |
| 2005/0228469 A1 | 10/2005 | Zarembo et al. |

FOREIGN PATENT DOCUMENTS

| | | |
|---|---|---|
| DE | 29 39 594 A1 | 4/1981 |
| DE | 10 2004 053 648 A1 | 5/2006 |
| DE | 10 2006 029 547 A1 | 12/2007 |
| GB | 314 529 A | 5/1930 |
| JP | S08-11885 U | 8/1933 |
| JP | S43-23499 U | 10/1968 |
| JP | 59-148878 A | 8/1984 |
| JP | S62-142801 U | 9/1987 |
| JP | H02-110902 U | 4/1990 |
| JP | H04-83175 A | 3/1992 |
| JP | 9-293601 A | 11/1997 |
| JP | 2002-48821 A | 2/2002 |
| JP | 2004-47603 A | 2/2004 |
| JP | 2005-536357 A | 12/2005 |
| JP | 2009-182144 A | 8/2009 |
| NO | 2004/018138 A1 | 3/2004 |
| WO | 2009/096386 A1 | 8/2009 |

OTHER PUBLICATIONS

Shribman, Victor, "Magnetic pulse technology for improved tube joining and forming," Tube & Pipe Technology, Nov./Dec. 2006 (pp. 91-95).

RESISTOR AND METHOD FOR MAKING SAME

CROSS REFERENCE TO RELATED APPLICATIONS

This application is a continuation of U.S. patent application Ser. No. 14/280,230, filed May 16, 2014, issuing as U.S. Pat. No. 9,378,872 on Jun. 28, 2016, which is a continuation of U.S. patent application Ser. No. 13/730,155, filed Dec. 28, 2012, now U.S. Pat. No. 8,730,003, issued May 20, 2014, which is a continuation of U.S. patent application Ser. No. 13/051,585, filed Mar. 18, 2011, now U.S. Pat. No. 8,344,846, issued Jan. 1, 2013, which is a divisional of U.S. patent application Ser. No. 12/026,939, filed Feb. 6, 2008, now U.S. Pat. No. 7,911,319, issued Mar. 22, 2011, the entire contents of all of which are hereby incorporated by reference as if fully set forth herein.

FIELD OF INVENTION

The present invention relates to resistors, particularly resistors in automotive and related applications.

BACKGROUND

As electronics content in a typical vehicle has substantially increased, the demands on the battery and charging system of a typical vehicle have also increased. Moreover, with the advent of the hybrid gas-electric car and all-electric cars the battery and charging system becomes an ever more vital part of a vehicle. An unhealthy electrical system in today's car may jeopardize vital functions such as steering and braking.

Therefore, it has become essential for onboard computers to have sensory information about the charge used, charge returned and charge available from the battery and the overall health of the charging system. The main sensor for this is a current sense resistor integrated into the battery cable.

Traditionally, this is a flat resistor made of a MANGANIN resistive element terminated by copper pieces welded or brazed to each end of the resistive element. MANGANIN is an alloy typically 86 percent copper, 12 percent manganese, and 2 percent nickel which provides low resistance. This flat resistor would be located at the end of the cable adjacent to the connector to the battery and would be surrounded by support electronics encased in a potted container. Such a resistor may also be used in applications other than automotive application such as, but not limited to, galvanic plating power supply cables, welding cables, and other applications.

Therefore, it is a primary object, feature, or advantage of the present invention to improve over the state of the art.

It is a further object, feature, or advantage of the present invention to provide a resistor suitable for use in automotive and related applications where the resistor is connected to a cable.

Yet another object, feature, or advantage of the present invention is to provide a resistor which allows current sensing.

One or more of these and/or other objects, features, and advantages of the present invention will become apparent from the specification and claims that follow.

SUMMARY

According to one aspect of the present invention, a resistor includes a substantially cylindrical resistive element having a resistance of less than about 1 mΩ, a substantially cylindrical first termination electrically connected to the resistive element, and a second termination electrically connected to the resistive element. The substantially cylindrical first termination is hollow to allow for accepting a connection such as from a battery cable. There may be one or more sense leads attached to the resistor.

According to another aspect of the invention, a method of forming a substantially cylindrical resistor is provided. The method includes forming a hollow cylindrical resistor body by rolling a flat sheet comprising a resistive element and a first termination and a second termination joined on opposite ends of the resistive element.

According to another aspect of the invention, a method of forming a substantially cylindrical resistor includes providing a first tube for a first termination, providing a second tube for a second termination, and magnetic pulse welding a resistive element between the first tube and the second tube to thereby provide a substantially cylindrical resistor.

DETAILED DESCRIPTION OF THE PREFERRED EMBODIMENTS

The present invention is generally directed towards a cylindrical resistor and a method of making the cylindrical resistor. The cylindrical resistor may be used in applications such as, but not limited to, automotive applications, galvanic plating power supply cables, welding cables, and other applications. The cylindrical shape allows the resistor to be integrated into a cable assembly in a more space efficient manner and also allows insertion at any position along the length of the cable. Flexibility in positioning allows support electronics to also be positioned in a location closer to other electronics modules or at the battery terminal.

Figure 1:
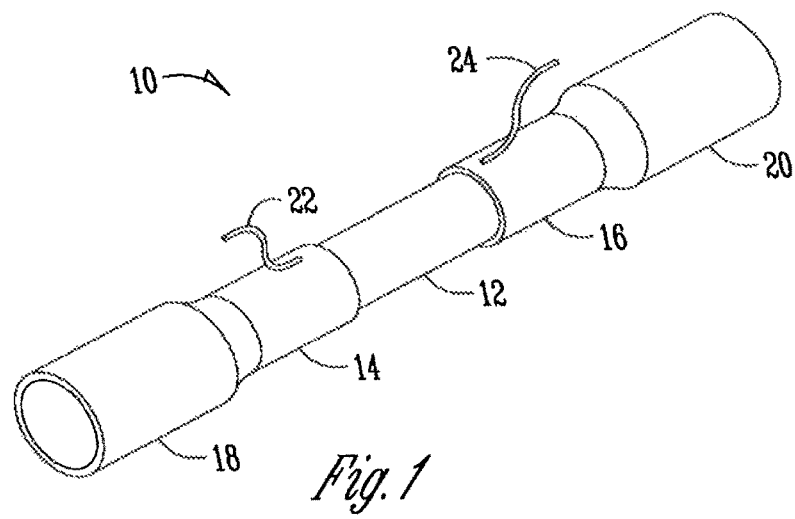
FIG. 1 is a perspective view of one embodiment of a cylindrical resistor of the present invention.
Figure 2:
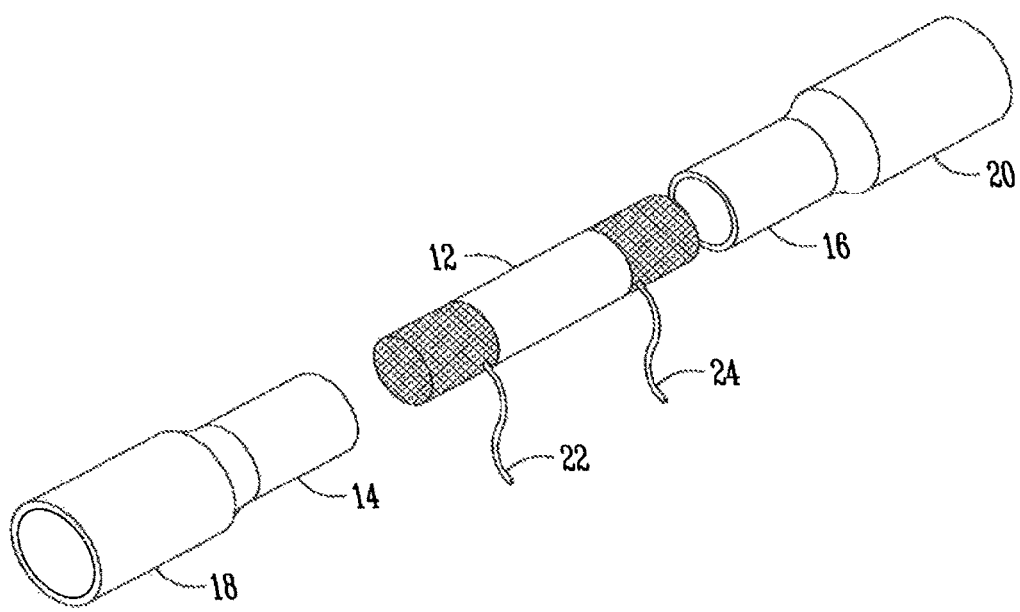
FIG. 2 is an exploded perspective view of one embodiment of the cylindrical resistor of the present invention.

FIG. 1 illustrates a perspective view of one embodiment of a cylindrical resistor 10. The cylindrical resistor 10 includes a resistive element 12. The resistive element 12 may be made from a cylindrical piece of MANGANIN wire, or other suitable resistive material. Each end of the resistive material is terminated with copper or another suitable conductive material to form the terminals 14, 16 of the resistor 10. The terminals 14, 16 may be used to connect the resistor 10 to the cable assembly and carry the main current. These terminals 14, 16 are attached to resistive element 12 by welding, brazing or crimping. The terminals 14, 16 may be capable of attachment to a battery cable assembly by welding, brazing or crimping. The geometry of the terminals may vary based on the particular application for which the cylindrical resistor is used and the present invention is not to be limited by the specific geometry of the terminals shown.

Integral to the attachment of these terminations there are one or more sense leads 22, 24 attached to the terminals 14, 16. These sense leads 22, 24 are used for connection to support electronics that require a sense voltage input in proportion to the electrical current passing through the resistor 10. These leads 22, 24 may be an extension of the resistor terminal material or may be otherwise added such as through welding, brazing, crimping, or other means. The specific geometry of these sense leads may vary according to specific applications and environments and the present invention is not to be limited to the specific geometries shown.

In one embodiment, the assembly of this shunt resistor 10 consists of copper tubes for the terminations 14, 16 and a piece of a substantially cylindrical MANGANIN resistance wire as the resistive element 12. The resistance wire is cut to a short segment. One end of the segment of resistance wire is placed in the end of one copper tube 18 and the two are joined by a magnetic pulse weld that uniformly collapses the tube onto the wire at such speed that a weld occurs. The other end of the MANGANIN wire resistive element is inserted into the end of the other copper tube 20 and joined by another magnetic pulse. Thus, a resistor such as resistor 10 in FIG. 1 is formed.

Figure 3:
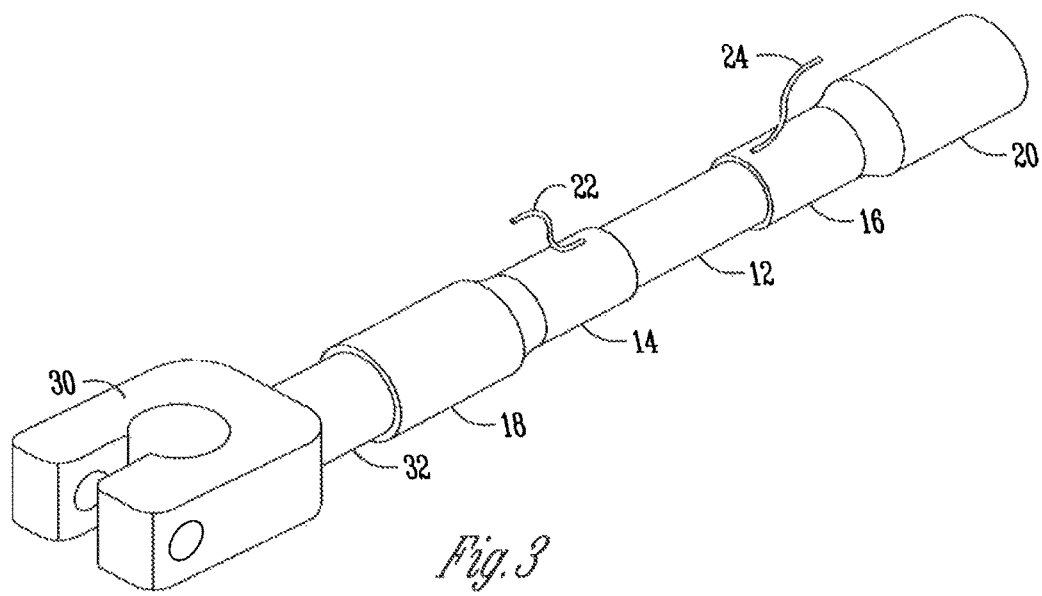
FIG. 3 is a perspective view of the cylindrical resistor connected to a battery cable assembly of a vehicle.
Figure 4:
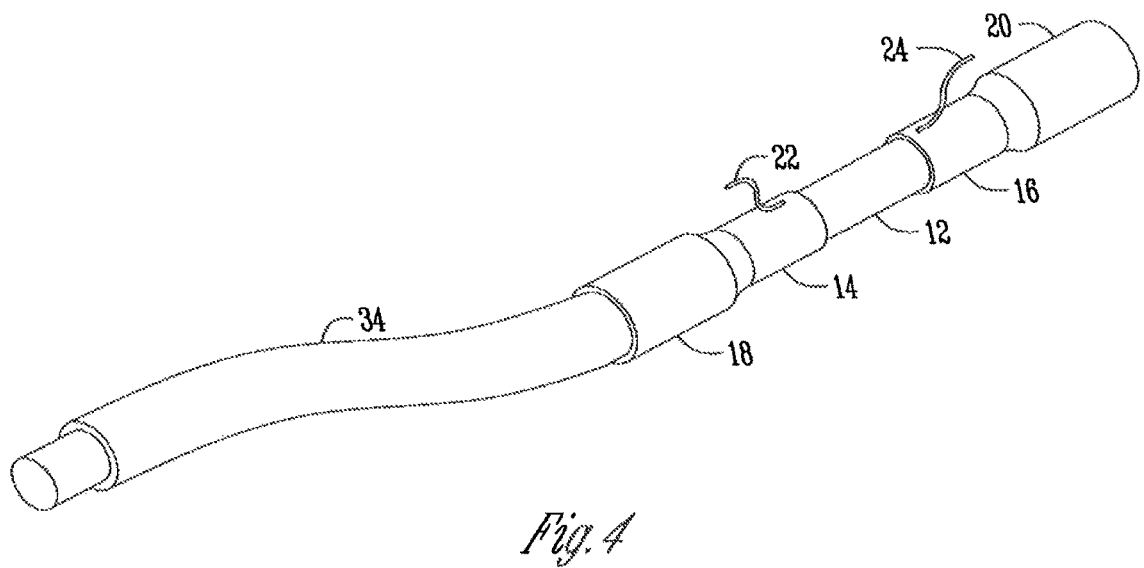
FIG. 4 is a perspective view of the cylindrical resistor connected to a battery cable of a vehicle.

The amount of unwelded resistive material between the ends of the two copper tubes 18, 20 determines the blank resistance value. Adjustment of the resistance value may be made by a lathe, abrasion, or lasering operation that reduces the diameter of the exposed MANGANIN wire or by removing copper from the end of each tube effectively lengthening the MANGANIN resistive element. In addition, resistance may be adjusted by adding termination material (such as copper or other conductive material) back to the resistive element such as by welding. At this point, the open ends of the copper tubes 18, 20 are ready to accept further processing steps to connect them to a cable assembly, such as inserting cable 34 into the open tube and magnetically pulse welding the two pieces together as shown in FIG. 4. This joint could also be made by soldering, crimping, brazing or other welding methods. A battery post clamp 30 having an end 32 could also be inserted to one of the open tube ends and secured in place as shown in FIG. 3. The battery post clamp may be secured by soldering, crimping, brazing, or other welding methods.

Figure 5:
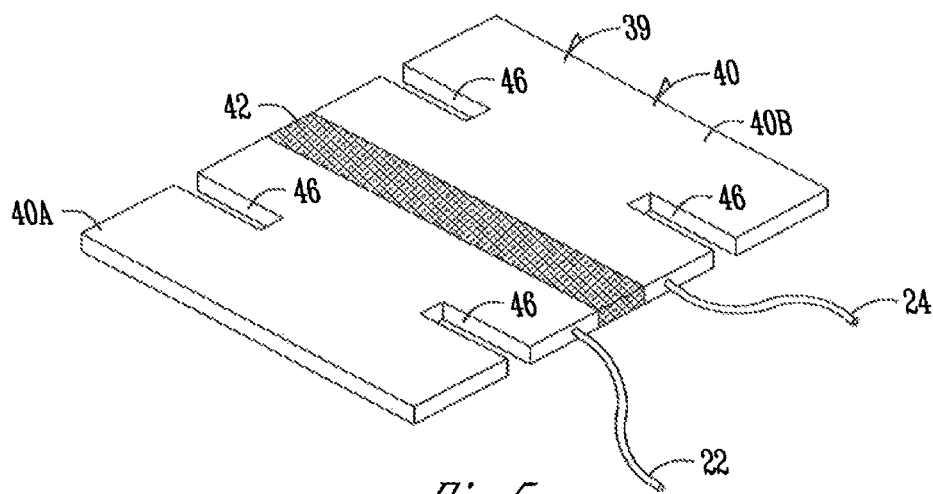
FIG. 5 illustrates a step in the process of forming a cylindrical resistor according to one embodiment.
Figure 6:
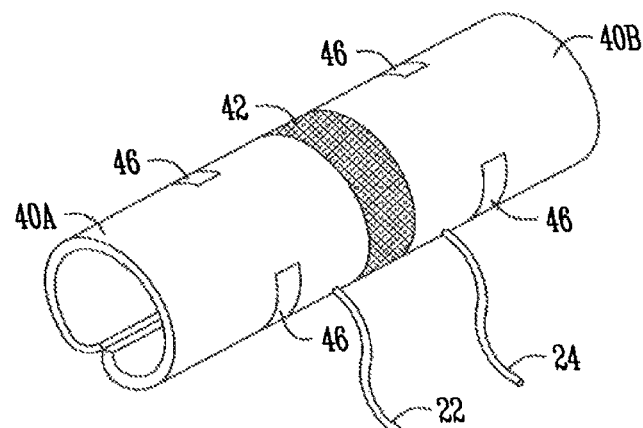
FIG. 6 illustrates a step in the process of forming a cylindrical resistor according to one embodiment.

FIG. 5 and FIG. 6 illustrate another embodiment of a cylindrical resistor. In this embodiment, the resistor utilizes a flat resistive element of MANGANIN, or other suitable resistive material, with copper, or other suitable conductive material, terminals welded to each end of the resistive material in the same fashion as may be used in fabricating power metal strip resistors such as disclosed in U.S. Pat. No. 5,604,477 to Rainer, herein incorporated by reference in its entirety.

In FIG. 5, a flat sheet 39 is shown. The flat sheet 39 includes a resistive material 42, and terminal material 40. The terminal material includes a first portion 40A and a second portion 40B on opposite sides of the resistive material 42. Sense lead 22 is electrically connected to and extends from the first portion 40A of the terminal material 40 while sense lead 24 is electrically connected to and extends from the second portion 40B of the terminal material 40.

The flat sheet 39 is rolled into a cylinder with the resistive material 42 becoming a band that curves around the circumference of the cylinder as best shown in FIG. 6. The resistive material 42 and terminal material 40 may have holes or slots 46 in specified areas to facilitate the roll forming process and to facilitate crimping to a cable. These slots 46 may also be used to adjust resistance value and TCR. The material from these slots 46 may be separated from the main body on three sides yet left connected on the fourth side to form a sense terminal integral to the resistor material.

Figure 7:
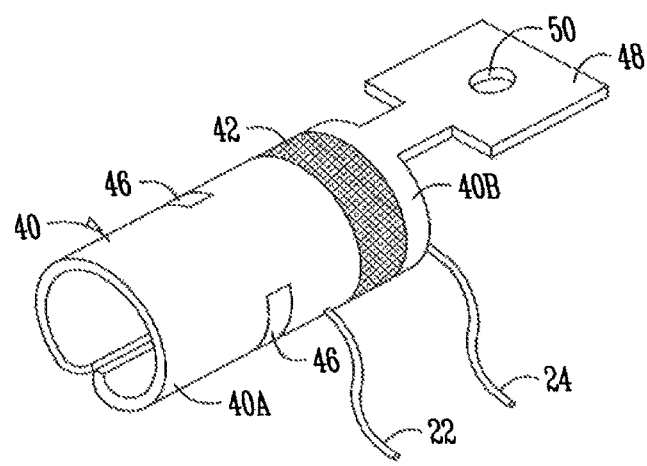
FIG. 7 illustrates a step in the process of making a cylindrical resistor according to one embodiment.

In another embodiment, shown in FIG. 7, the resistor is configured to allow for one termination 40A to be cylindrical for attachment to a cable while the second termination area 40B has a flat terminal 48 which may include an aperture 50. The flat terminal 48 may be connected to a battery post or other stud mount connector.

Note that when the cylindrical resistor is hollow, the resistive element may be cooled by circulating a fluid through it. Cooling may be desirable in certain environments.

The cylindrical resistors of the present invention have resistance values less than 1 mΩ and are designed to handle current of 200 A or more. Thus, the cylindrical resistors are well-suited to automotive applications, battery monitoring applications, and related applications where a low resistance is desired.

Therefore, a cylindrical resistor has been disclosed. The present invention contemplates variations in the size, shape, materials used, resistance, and other variations. Although various embodiments are shown and described, the present invention is not to be limited to the specific embodiments shown.

What is claimed is:

1. A resistor comprising:
   a cylindrical resistive element having a first end and a second end;
   a first terminal adjacent the first end of the resistive element, the first terminal comprising a tube having a first end connected to the resistive element, and a second end comprising an opening facing away from the resistive element, the tube having at least one cylindrical wall encircling a longitudinal axis of the resistor;
   a second terminal adjacent the second end of the resistive element;
   a first sense lead electrically connected to the cylindrical wall of the first terminal and having at least a portion extending away from the longitudinal axis of the resistor; and
   a second sense lead electrically connected to the second terminal and having at least a portion extending away from the longitudinal axis of the resistor.

2. The resistor of claim 1, wherein the first sense lead is positioned between a central portion of the resistive element and an outer end of the first terminal.

3. The resistor of claim 2, wherein the second sense lead is positioned between a central portion of the resistive element and an outer end of the second terminal.

4. The resistor of claim 1, wherein the first terminal comprises a cylindrical opening adjacent the first end of the resistive element.

5. The resistor of claim 4, wherein the cylindrical opening adjacent the first end of the resistive element receives at least a portion of the first end of the resistive element.

6. The resistor of claim 5, wherein the first terminal comprises cylindrical walls of different diameters.

7. The resistor of claim 6, wherein the opening of the second end of the tube axially receives an external connection, and wherein the external connection comprises a cable or battery post.

8. The resistor of claim 4, wherein the second terminal comprises a cylindrical opening adjacent the second end of the resistive element.

9. The resistor of claim 8, wherein the cylindrical opening adjacent the second end of the resistive element receives at least a portion of the second end of the resistive element.

10. The resistor of claim 1, wherein the resistive element comprises a cylindrical wall encircling the longitudinal axis of the resistor.

11. The resistor of claim 1, wherein the resistive element comprises a segment of resistance wire.

12. The resistor of claim 1, further comprising a flat terminal portion.

13. A method of forming a resistor, comprising:
providing a cylindrical resistive element having a first end and an opposite second end between a first terminal adjacent the first end of the resistive element, and a second terminal adjacent the second end of the resistive element, the first terminal comprising a tube having a first end connected to the resistive element, and a second end comprising an opening facing away from the resistive element, the tube having at least one cylindrical wall encircling a longitudinal axis of the resistor;
electrically connecting a first sense lead to the cylindrical wall of the first terminal, at least a portion of the first sense lead extending away from the longitudinal axis of the resistor; and
electrically connecting a second sense lead to the second terminal, at least a portion of the second sense lead extending away from the longitudinal axis of the resistor.

14. The method of claim 13, wherein step of electrically connecting comprises positioning the first sense lead between a central portion of the resistive element and an outer end of the first terminal.

15. The method of claim 14, wherein step of electrically connecting comprises positioning the second sense lead between a central portion of the resistive element and an outer end of the second terminal.

16. The method of claim 13, wherein the first terminal comprises a cylindrical opening adjacent the first end of the resistive element.

17. The method of claim 16, wherein the cylindrical opening adjacent the first end of the resistive element receives at least a portion of the first end of the resistive element.

18. The method of claim 17, wherein the tube is formed having cylindrical walls of different diameters.

19. The method of claim 18, further comprising axially engaging an external connection within the opening at the second end of the first terminal, wherein the external connection comprises a cable or battery post.

20. The method of claim 16, wherein the second terminal comprises a cylindrical opening adjacent the second end of the resistive element.

21. The method of claim 20, wherein the cylindrical opening adjacent the second end of the resistive element receives at least a portion of the second end of the resistive element.

22. The method of claim 13, wherein the resistive element comprises a cylindrical wall encircling the longitudinal axis of the resistor.

23. The method of claim 13, wherein the resistive element comprises a segment of resistance wire.

24. The method of claim 13, further comprising a flat terminal portion.

* * * * *